US012803556B2

(12) United States Patent
Hoang

(10) Patent No.: US 12,803,556 B2
(45) Date of Patent: Nov. 17, 2026

(54) CONTROL DEVICE AND IMAGE PROCESSING APPARATUS

(71) Applicant: KYOCERA Document Solutions Inc., Osaka (JP)

(72) Inventor: Tuan Manh Hoang, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 61 days.

(21) Appl. No.: 19/011,946

(22) Filed: Jan. 7, 2025

(65) Prior Publication Data

US 2025/0226828 A1 Jul. 10, 2025

(30) Foreign Application Priority Data

Jan. 10, 2024 (JP) ................................ 2024-001770

(51) Int. Cl.
*H03K 19/17784* (2020.01)
*H03K 19/20* (2006.01)

(52) U.S. Cl.
CPC ....... *H03K 19/17784* (2013.01); *H03K 19/20* (2013.01)

(58) Field of Classification Search
None
See application file for complete search history.

(56) References Cited

U.S. PATENT DOCUMENTS

2021/0226629 A1* 7/2021 De Oliveira .............. G06F 1/06

FOREIGN PATENT DOCUMENTS

JP H0934737 A * 2/1997 .......... G06F 11/0757
JP H10136566 A 5/1998
JP 2015009464 A * 1/2015

* cited by examiner

*Primary Examiner* — Jany Richardson
(74) *Attorney, Agent, or Firm* — Alleman Hall LLP

(57) ABSTRACT

A control device includes a signal generating portion, a signal output portion, and a correction circuit. The signal generating portion is configured to output a first signal from an output terminal. The signal output portion includes an input terminal configured to receive the first signal. The signal output portion is configured to output a control signal corresponding to the first signal. The correction circuit is inserted between the output terminal of the signal generating portion and the input terminal of the signal output portion. The correction circuit is configured to set a voltage of the input terminal to a specific value in accordance with a second signal from outside.

3 Claims, 8 Drawing Sheets

FIG. 5

| INPUT | H | L | Hi-Z |
|---|---|---|---|
| Si11 | H | L | L |
| Si12 | L | H | L |

| INPUT | H | L | Hi-Z |
|---|---|---|---|
| Si11 | H | L | L |
| Si12 | L | H | L |

FIG. 6

| INPUT | | V1 |
|---|---|---|
| Si2 | Si1 | |
| L | L | L |
| L | H | L |
| H | L | L |
| H | H | H |

CONTROL DEVICE AND IMAGE PROCESSING APPARATUS

INCORPORATION BY REFERENCE

This application is based upon and claims the benefit of priority from the corresponding Japanese Patent Application No. 2024-001770 filed on Jan. 10, 2024, the entire contents of which are incorporated herein by reference.

This disclosure relates to a control device and an image processing apparatus.

BACKGROUND

A control device (data transfer processing device) that is used for a copying machine or the like and performs data communication between input and output buffers driven by power voltages supplied from different power supplies through predetermined communication media has been known as the related art.

The control device according to the related art transfers data between the output buffer driven by a first power supply voltage supplied from a first power supply and the input buffer driven by a second power supply voltage supplied from a second power supply. This control device includes a first buffer control means. The first buffer control means detects the fluctuation state of the second power supply voltage supplied from the second power supply and controls the varying output level of the output buffer. When transferring data, this control device catches a fluctuation in a power supply voltage and controls a digital output of the output buffer, thereby making it possible to prevent an overcurrent from flowing to each of the input and output buffers because of a fluctuation in one of the power supply voltages.

SUMMARY

A control device according to an aspect of this disclosure includes a signal generating portion, a signal output portion, and a correction circuit. The signal generating portion is configured to output a first signal from an output terminal. The signal output portion includes an input terminal configured to receive the first signal. The signal output portion is configured to output a control signal corresponding to the first signal. The correction circuit is inserted between the output terminal of the signal generating portion and the input terminal of the signal output portion. The correction circuit is configured to set a voltage of the input terminal to a specific value in accordance with a second signal from outside.

An image processing apparatus according to another aspect of this disclosure includes the control device and a body having an image processing function.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 5 is a table showing a relationship of a signal of the image processing apparatus according to the embodiment 1.

FIG. 6 is a table showing the relationship of the signal of the image processing apparatus according to the embodiment 1.

DETAILED DESCRIPTION

Hereinafter, embodiments of this disclosure will be described with reference to the appended drawings. It is to be noted that the following embodiments are specific examples of this disclosure and do not intend to limit the technical scope of this disclosure.

Embodiment 1

[1] Overall Configuration of Image Processing Apparatus

First, the overall configuration of an image processing apparatus 10 according to this embodiment will be described with reference to FIGS. 1 and 2.

As an example, the image processing apparatus 10 according to this embodiment is a multifunction peripheral having a plurality of functions such as a scan function of acquiring image data from a document sheet, a print function of forming an image on the basis of the image data, a facsimile function, and a copy function. It is sufficient if the image processing apparatus 10 has an image processing function including at least one of the function of forming an image and the function of acquiring image data. The image processing apparatus 10 may be a printer, a scanner, a facsimile apparatus, a copier, and the like.

Figure 1:
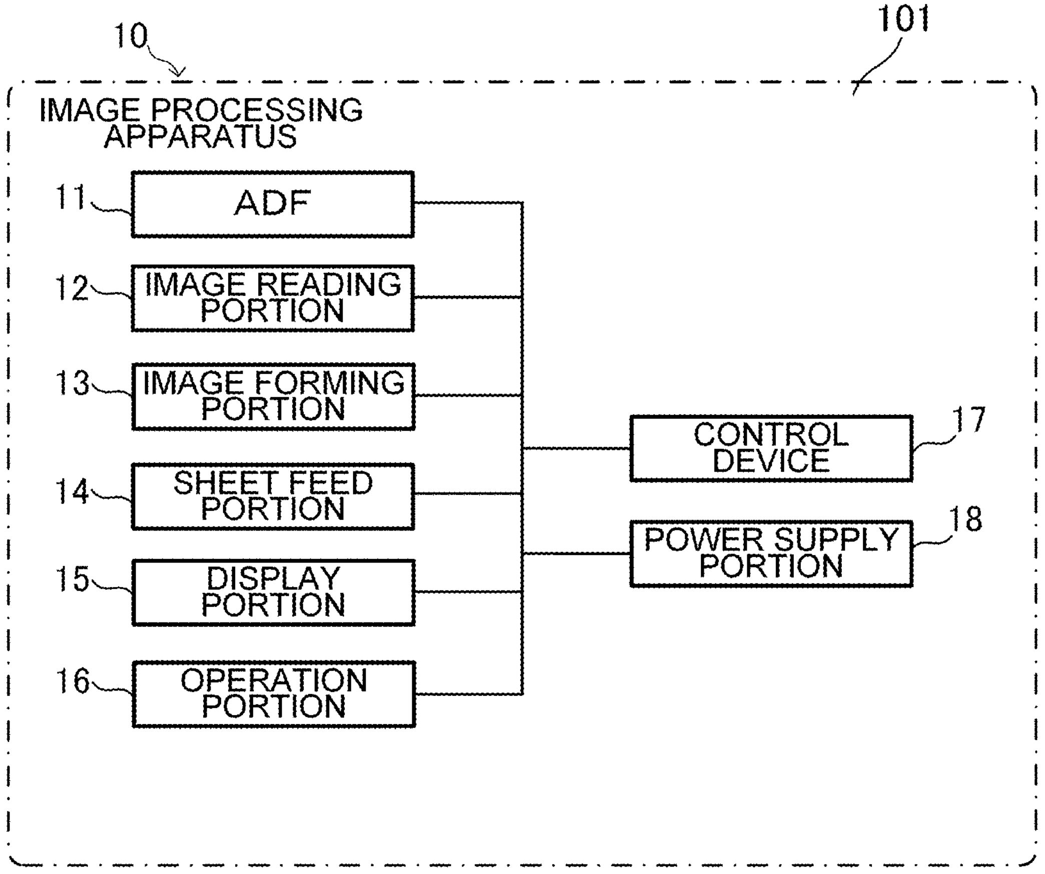
FIG. 1 is a schematic block diagram of an image processing apparatus according to an embodiment 1.
Figure 2:
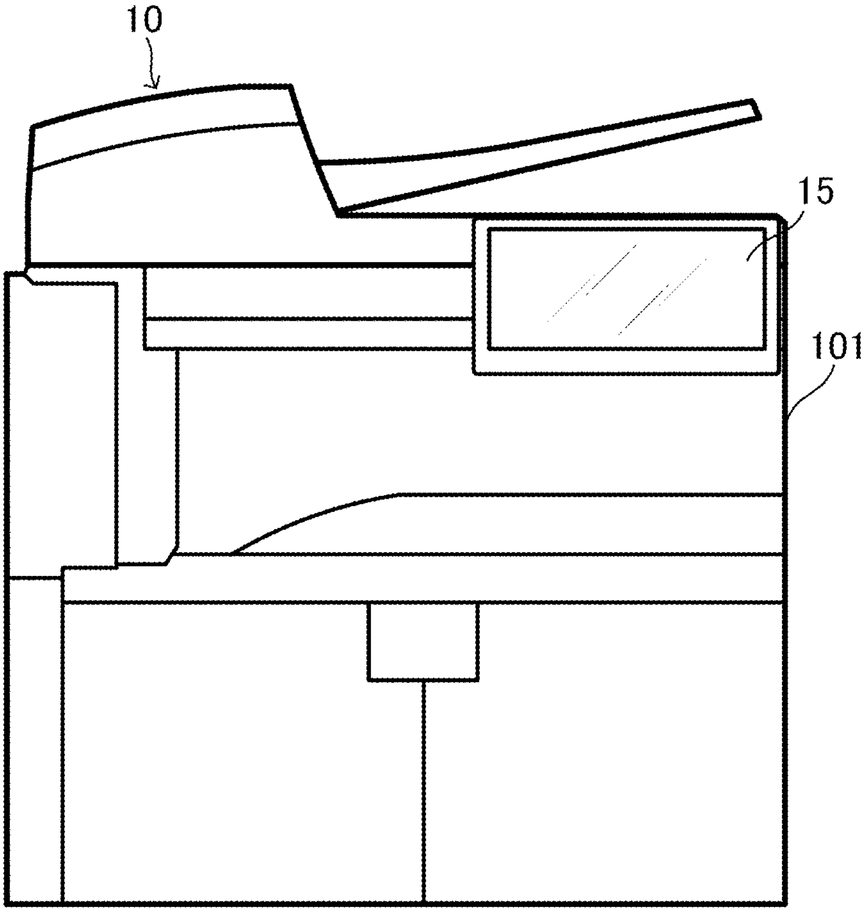
FIG. 2 is an outline diagram showing external appearance of the image processing apparatus according to the embodiment 1.

As shown in FIG. 1, the image processing apparatus 10 includes an automatic document sheet conveying device 11, an image reading portion 12, an image forming portion 13, a sheet feed portion 14, a display portion 15, an operation portion 16, a control device 17, and a power supply portion 18. The automatic document sheet conveying device 11 is an auto document feeder (ADF). The automatic document sheet conveying device 11 is thus described as an "ADF" in FIG. 1 and will also be referred to as the "ADF 11" in the following description. In this embodiment, as shown in FIG. 2, the image processing apparatus 10 includes a body 101. The ADF 11, the image reading portion 12, the image forming portion 13, the sheet feed portion 14, the display portion 15, the operation portion 16, the control device 17, and the power supply portion 18 are provided to the body 101.

The ADF 11 conveys a document sheet an image on which is read by the image reading portion 12. The ADF 11 includes a document sheet set portion, a plurality of conveying rollers, a document sheet holder, a sheet discharge portion, and the like.

The image reading portion 12 reads an image from a document sheet and outputs image data corresponding to the read image. The image reading portion 12 includes a document sheet table, a light source, a plurality of mirrors, an optical lens, a charge coupled device (CCD), and the like.

The image forming portion 13 forms an image on a sheet in an electrophotographic method on the basis of image data output from the image reading portion 12. In addition, the image forming portion 13 forms an image on a sheet on the basis of image data input from an information processing apparatus outside the image processing apparatus 10 such as a personal computer. The image forming portion 13 includes four image forming units corresponding to the four colors of C (cyan), M (magenta), Y (yellow), and K (black), a laser scanning unit, an intermediate transfer belt, a secondary transfer roller, a fixing device, and the like. For example, the image forming portion 13 may be configured to form an image on a sheet in an image forming method such as an ink jet method other than the electrophotographic method.

The image forming portion 13 forms an image on a sheet by using toner serving as a developer. In a case where the image forming portion 13 forms an image in an ink jet method, ink (another example of the developer) is supplied instead of toner. Examples of the toner supplied to the image forming portion 13 include toners for the plurality of colors of C (cyan), M (magenta), Y (yellow), and K (black). The sheet having an image formed thereon by the image forming portion 13 is discharged (supplied) to an extension device or the like for a post-process.

The sheet feed portion 14 supplies a sheet to the image forming portion 13. The sheet feed portion 14 includes a sheet feed cassette, a manual feed tray, a sheet conveyance path, a plurality of conveying rollers, and the like. In this embodiment, the sheet feed portion 14 includes a plurality of sheet feed sources (including two or more sheet feed cassettes and a manual feed tray). The image forming portion 13 forms an image on a sheet supplied from the sheet feed portion 14. The sheet supplied to the image forming portion 13 is paper as an example, but is not limited to paper. For example, the sheet supplied to the image forming portion 13 may be a resin film or the like.

The display portion 15 is a user interface that presents (displays) information to a user in the image processing apparatus 10. The display portion 15 displays various kinds of information in accordance with a control instruction from the control device 17. In this embodiment, as an example, the display portion 15 includes a liquid-crystal display and displays, on the liquid-crystal display, a display screen including various kinds of information.

The operation portion 16 is, for example, a user interface that receives an operation input made by a user on a display screen displayed on the display portion 15. The operation portion 16 outputs, for example, electrical signals corresponding to operations of the user, thereby receiving various operations made by the user. In this embodiment, as an example, the operation portion 16 includes a switch, a touch panel, or the like.

In addition, the image processing apparatus 10 may include, for example, a sound output portion, a sound input portion, and the like as user interfaces in addition to or instead of the display portion 15 and the operation portion 16.

The control device 17 includes, as a main component, a computer system including one or more processors and one or more memories and integrally controls the image processing apparatus 10. In the image processing apparatus 10, the one or more processors execute a program, thereby achieving a function of the control device 17. In this embodiment, as an example, the control device 17 includes a central processing unit (CPU).

The program may be recorded in the one or more memories in advance, provided through an electric communication line such as the Internet, or recorded and provided in a non-transitory recording medium such as a memory card or an optical disc readable to the computer system. The one or more processors each include one or more electronic circuits including a semiconductor integrated circuit. Furthermore, the computer system here includes a microcontroller including one or more processors and one or more memories. The control device 17 may be a control portion provided separately from a main control portion that integrally controls the image processing apparatus 10.

Specifically, the control device 17 transmits (outputs) a control signal to each of the devices such as the ADF 11, the image reading portion 12, the image forming portion 13, the sheet feed portion 14, and the display portion 15, thereby controlling the device. The control device 17 outputs, for example, a paper feeder (PF) selection signal and a clock signal to the sheet feed portion 14 as control signals. The PF selection signal is a control signal for selecting a sheet feed source and the clock signal is a control signal for designating a timing of causing the sheet feed portion 14 to supply a sheet. The control device 17 hereby allows the sheet feed portion 14 to feed a sheet from any sheet feed source among the plurality of sheet feed sources (including the two or more sheet feed cassettes and the manual feed tray) at any timing.

The power supply portion 18 is a device that generates (outputs) power for bringing the image processing apparatus 10 into operation. The power supply portion 18 is electrically connected to one or more electrical loads and supplies the one or more electrical loads with power. In this embodiment, the body 101 of the image processing apparatus 10 serves as an "electrical load" and the power supply portion 18 supplies power to each portion of the body 101 serving as an electrical load. That is, the one or more electrical loads each supplied with power from the power supply portion 18 include the ADF 11, the image reading portion 12, the image forming portion 13, the sheet feed portion 14, the display portion 15, the operation portion 16, and the control device 17.

In this embodiment, the power supply portion 18 is electrically connected to an AC plug. The power supply portion 18 converts a voltage of 100 VAC (or 200 VAC) applied to the AC plug, for example, to a voltage of 24 VDC and a voltage of 3.3 VDC (or 5 VDC). That is, alternating-current power is applied to the power supply portion 18 from an alternating-current power supply such as a system power supply when the AC plug is connected to an outlet (socket). The power supply portion 18 thus generates direct-current power from this alternating-current power.

In addition, the image processing apparatus 10 further includes a storage portion, a communication portion, and the like. The storage portion includes one or more non-volatile memories and stores, in advance, information regarding a control program or the like for causing the control device 17 to execute various processes. The communication portion is an interface that executes data communication with an external apparatus connected to the image processing apparatus 10, for example, through a communication network such as the Internet or a local area network (LAN).

[2] Configuration for Transmission of Control Signal

Next, a configuration for the transmission of a control signal will be described in more detail with reference to FIGS. 3 to 8.

As described above, the image processing apparatus 10 according to this embodiment transmits (outputs) control signals such as a PF selection signal and a clock signal, for example, to a device such as the sheet feed portion 14 from the control device 17, thereby controlling the device. That is, the sheet feed portion 14 is an example of a device that is controlled by using the control signals and the PF selection signal and the clock signal are examples of the control signals.

The following assumes that the control signals are a first PF selection signal Si11 and a second PF selection signal Si12. The first PF selection signal Si11 and the second PF selection signal Si12 are voltage signals that each have a voltage value varying between a high (H) level and a low (L) level. The device (sheet feed portion 14) does not then select any of the sheet feed sources when the first PF selection signal Si11 and the second PF selection signal Si12 are both at the H level. The device (sheet feed portion 14) selects a first sheet feed source when the first PF selection signal Si11 is at the H level and the second PF selection signal Si12 is at the L level. The device (sheet feed portion 14) selects a second sheet feed source when the first PF selection signal Si11 is at the L level and the second PF selection signal Si12 is at the H level.

Figure 3:
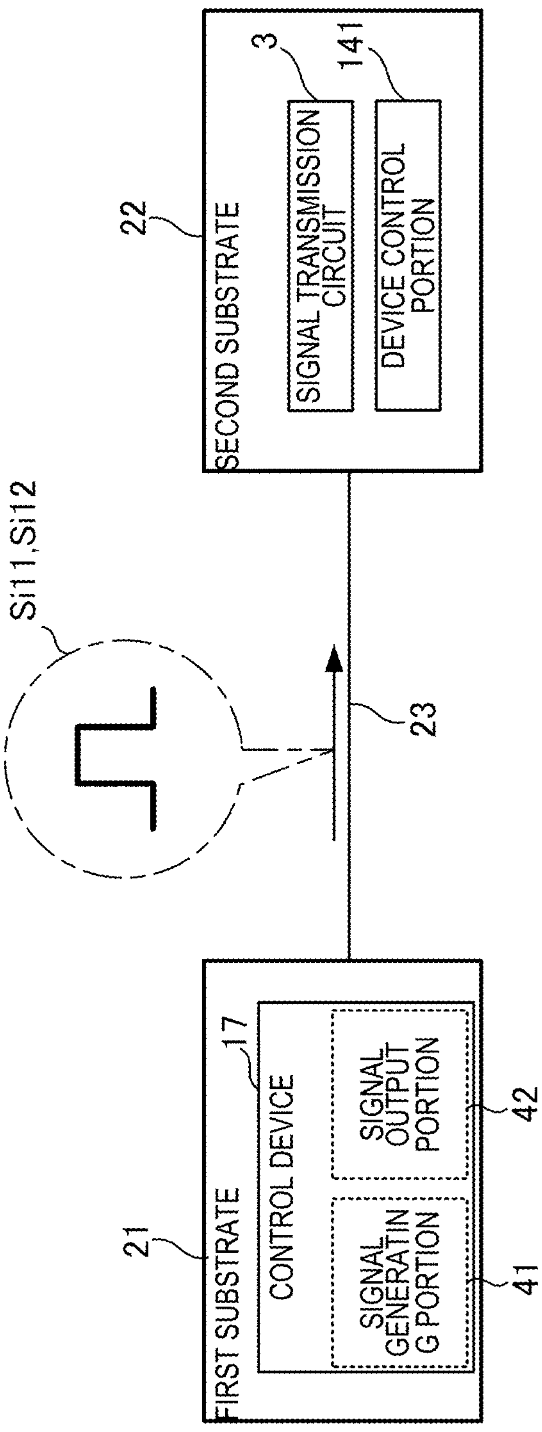
FIG. 3 is a schematic diagram showing a transmission state of a control signal of the image processing apparatus according to the embodiment 1.

As shown in FIG. 3, the image processing apparatus 10 according to this embodiment includes a first substrate (engine substrate) 21 serving as the transmission source of the control signals and a second substrate (PF substrate) 22 serving as the transmission destination of the control signals. The control device 17 is implemented in the first substrate 21 and a device control portion 141 included in the devices such as the sheet feed portion 14 is implemented in the second substrate 22. Furthermore, a signal transmission circuit 3 is implemented in the second substrate 22. The first substrate 21 and the second substrate 22 are electrically connected by a signal line 23 serving as the transmission path of the control signals (the first PF selection signal Si11 and the second PF selection signal Si12 here).

In this way, the control device 17 according to this embodiment is included in the image processing apparatus 10 along with the body 101 having an image processing function. In other words, the image processing apparatus 10 includes the control device 17 and the body 101 having an image processing function.

According to this configuration, the control signals (the first PF selection signal Si11 and the second PF selection signal Si12 here) output from the control device 17 of the first substrate 21 are transmitted to the signal transmission circuit 3 of the second substrate 22 through the signal line 23. The signal transmission circuit 3 transmits the input control signals to the device control portion 141. The device control portion 141 hereby brings a device such as the sheet feed portion 14 into operation in accordance with the control signals.

Here, the control device 17 includes a signal generating portion 41 and a signal output portion 42. The signal generating portion 41 generates a first signal Si1 (see FIG. 4). The signal output portion 42 outputs the control signals (the first PF selection signal Si11 and the second PF selection signal Si12 here) corresponding to the first signal Si1.

The signal generating portion 41 includes a CPU in this embodiment. That is, in this embodiment, as an example, the first signal Si1 is a "PF_CS signal" and an output terminal 410 (see FIG. 4) that outputs the first signal Si1 in the signal generating portion 41 is a "PF_CS terminal" of the CPU.

The signal output portion 42 includes an input terminal 420 (see FIG. 4), transistors Tr1, Tr2, and Tr3 (see FIG. 7), and the like. The signal output portion 42 outputs the first PF selection signal Si11 and the second PF selection signal Si12 depending on whether the first signal Si1 input to the input terminal 420 from the signal generating portion 41 is at the H level or the L level. In this embodiment, as an example, if the first signal Si1 is at the H level, the first PF selection signal Si11 reaches the H level and the second PF selection signal Si12 reaches the L level. If the first signal Si1 is at the L level, the first PF selection signal Si11 reaches the L level and the second PF selection signal Si12 reaches the H level (see FIG. 5).

However, in this configuration, for example, the signal generating portion 41 including a CPU is reset when the image processing apparatus 10 is powered on, and the input terminal 420 of the signal output portion 42 has high impedance during the reset operation in some cases. When the input terminal 420 of the signal output portion 42 has high impedance, the first PF selection signal Si11 and the second PF selection signal Si12 both reach the L level. It is not expected that the first PF selection signal Si11 and the second PF selection signal Si12 both reach the L level in this case. This may lead to a malfunction of the device (sheet feed portion 14).

Incidentally, a control device (data transfer processing device) that is used for a copying machine or the like and performs data communication between input and output buffers driven by power voltages supplied from different power supplies through predetermined communication media has been known as the related art.

The control device according to the related art transfers data between the output buffer driven by a first power supply voltage supplied from a first power supply and the input buffer driven by a second power supply voltage supplied from a second power supply. This control device includes a first buffer control means. The first buffer control means detects the fluctuation state of the second power supply voltage supplied from the second power supply and controls the varying output level of the output buffer. When transferring data, this control device catches a fluctuation in a power supply voltage and controls a digital output of the output buffer, thereby making it possible to prevent an overcurrent from flowing to each of the input and output buffers because of a fluctuation in one of the power supply voltages.

In the configuration according to the related art, for example, when the power supply is turned on, the transmission source (output buffer) of a signal (data) is reset in some cases. At that time, the input terminal of the transmission destination (input buffer) of the signal may have high impedance and this may lead to a malfunction of a device subsequent to the input buffer.

In contrast, in this embodiment, a configuration described below achieves the control device 17 and the image processing apparatus 10 that are each less likely to undergo a device malfunction.

Figure 4:
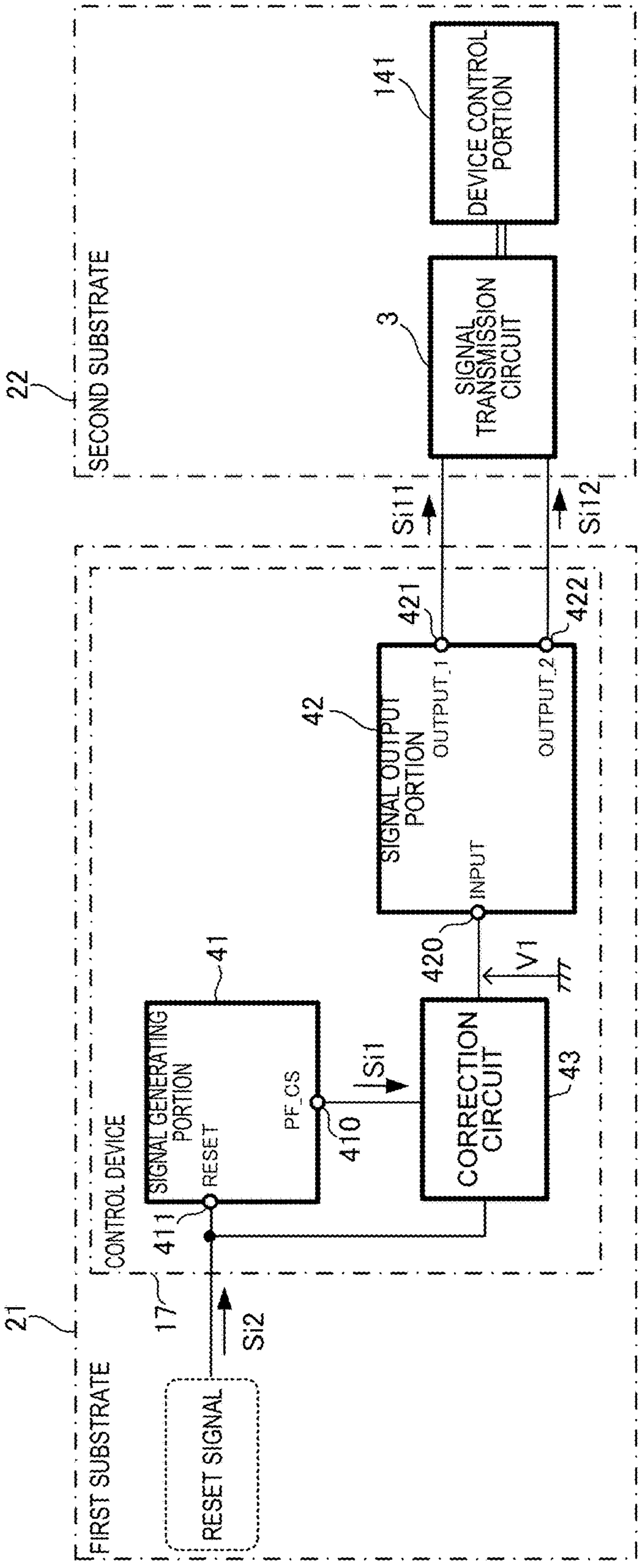
FIG. 4 is a schematic block diagram showing a configuration of a control device of the image processing apparatus according to the embodiment 1.

That is, as shown in FIG. 4, the control device 17 according to this embodiment includes the signal generating portion 41, the signal output portion 42, and a correction circuit 43. The signal generating portion 41 outputs the first signal Si1 from the output terminal 410. The signal output portion 42 includes the input terminal 420 that receives the first signal Si1. The signal output portion 42 outputs the control signals (the first PF selection signal Si11 and the second PF selection signal Si12) corresponding to the first signal Si1. The correction circuit 43 is inserted between the output terminal 410 of the signal generating portion 41 and the input terminal 420 of the signal output portion 42. The correction circuit 43 sets a voltage V1 of the input terminal 420 to the specific value in accordance with a second signal Si2.

According to this configuration, it is possible for the control device 17 to forcibly set the voltage V1 of the input terminal 420 to a specific value in accordance with the second signal Si2 from the outside (of the correction circuit 43). For example, when the image processing apparatus 10 is powered on, the signal generating portion 41 (CPU) that is the transmission source of the first signal Si1 is reset in some cases, but it is possible for the correction circuit 43 to set the voltage V1 of the input terminal 420 at this time to the specific value. This makes it possible to prevent the input terminal 420 of the signal output portion 42 from having high impedance. This control device 17 thus has an advantage that the device (sheet feed portion 14) is less likely to malfunction because of the high impedance of the input terminal 420 of the signal output portion 42.

In short, as shown in the upper part of FIG. 5, the high impedance (Hi-Z) of the input terminal 420 (INPUT) of the signal output portion 42 causes an expected state in which the first PF selection signal Si11 and the second PF selection signal Si12 are both at the L level. Accordingly, the control device 17 according to this embodiment forcibly sets the voltage V1 of the input terminal 420 to the specific value by using the correction circuit 43, thereby deleting a state in which the input terminal 420 (INPUT) of the signal output portion 42 has high impedance (Hi-Z) as shown in the lower part of FIG. 5. This makes the device (sheet feed portion 14) less likely to malfunction.

If described in more detail, the second signal Si2 is a reset signal that is input to the signal generating portion 41 and is used to reset the signal generating portion 41. That is, the signal generating portion 41 includes a reset (RESET) terminal 411 that receives a reset signal serving as the second signal Si2. Therefore, for example, when the image processing apparatus 10 is powered on, the second signal Si2 that is a reset signal reaches the L level, thereby resetting the the signal generating portion 41. At this time, the correction circuit 43 sets the voltage V1 of the input terminal 420 of the signal output portion 42 to the specific value in accordance with the second signal Si2 that is a reset signal.

According to this configuration, it is possible to set the voltage V1 of the input terminal 420 to the specific value during a reset operation of the signal generating portion 41 (CPU) that is the transmission source of the first signal Si1. This makes it possible to prevent the input terminal 420 of the signal output portion 42 from having high impedance even during the reset operation of the signal generating portion 41 (CPU) and makes the device (sheet feed portion 14) less likely to malfunction.

Figure 7:
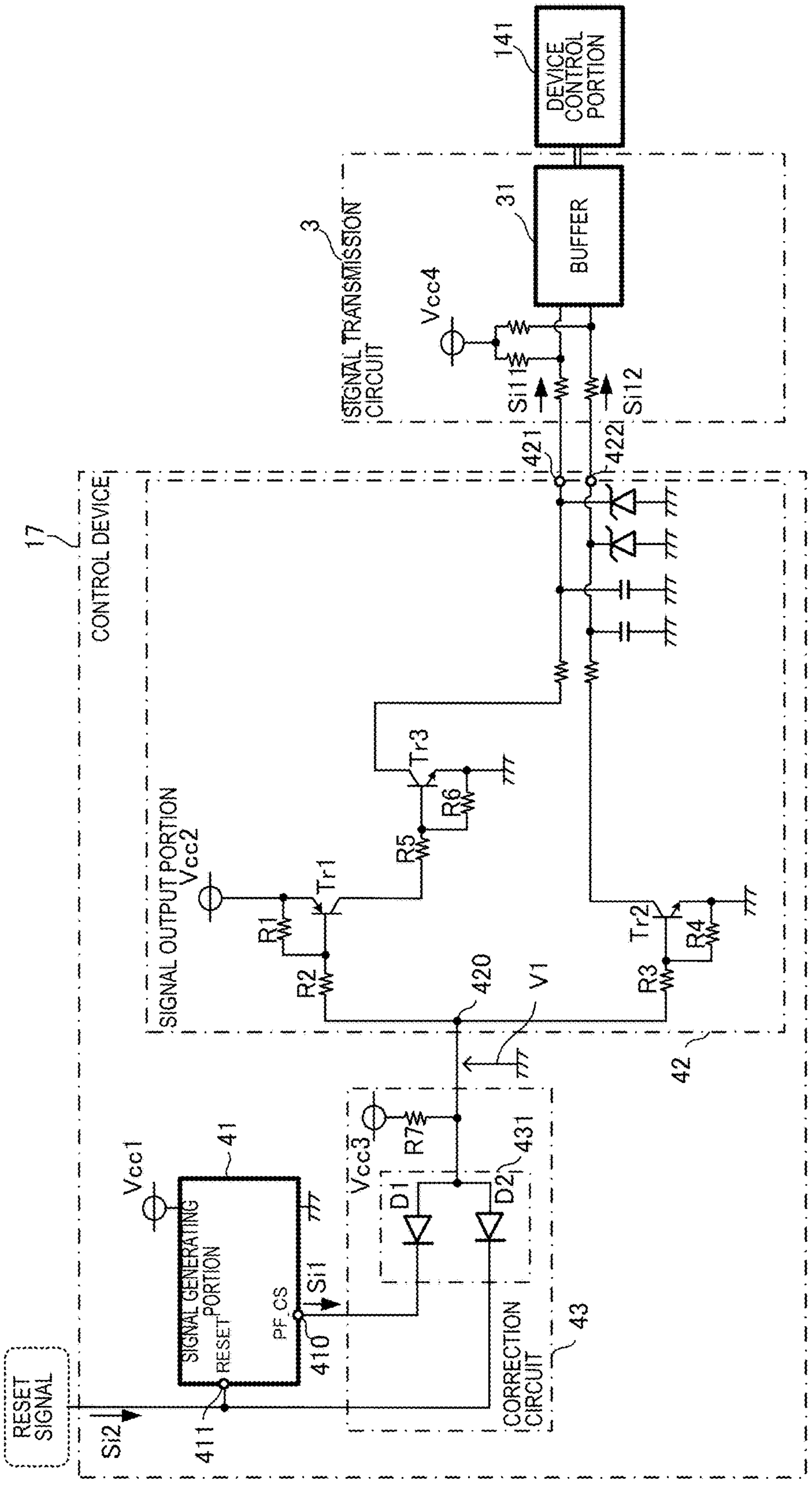
FIG. 7 is a schematic circuit diagram showing a specific example of the control device of the image processing apparatus according to the embodiment 1.

In addition, the correction circuit 43 includes an AND circuit 431 (see FIG. 7). The AND circuit 431 outputs the logical conjunction of the first signal Si1 and the second signal Si2 to the input terminal 420. This causes the first signal Si1 and the second signal Si2, and the voltage V1 of the input terminal 420 to have the relationship shown in the table of FIG. 6. That is, only in a case where the first signal Si1 and the second signal Si2 are both at the H level, the voltage V1 of the input terminal 420 reaches the H level. If at least one of the first signal Si1 and the second signal Si2 is at the L level, the voltage V1 of the input terminal 420 reaches the L level.

According to this configuration, it is possible for the correction circuit 43 to set the voltage V1 of the input terminal 420 to the L level irrespective of the state of the first signal Si1 in a case where the second signal Si2 is at the L level. That is, in this embodiment, the correction circuit 43 sets the voltage V1 of the input terminal 420 to the specific value in accordance with the second signal Si2 and the specific value is thus the L level as an example. As a result, such an advantage is offered that the device (sheet feed portion 14) is less likely to malfunction because of the high impedance of the input terminal 420 of the signal output portion 42.

FIG. 7 shows specific examples of the control device 17 and the signal transmission circuit 3 according to this embodiment.

That is, the CPU serving as the signal generating portion 41 includes the "PF_CS terminal" serving as the output terminal 410 that outputs the first signal Si1 (PF_CS signal) and the reset terminal 411 that receives the second signal Si2 (reset signal). The CPU serving as the signal generating portion 41 receives a power supply voltage (3.3 V as an example) from a constant voltage source Vcc1 and comes into operation.

The signal output portion 42 includes resistors R1 to R6, the transistors Tr1, Tr2, and Tr3, a first output terminal 421 that outputs the first PF selection signal Si11, and a second output terminal 422 that outputs the second PF selection signal Si12. The transistor Tr1 is a pnp-type bipolar transistor. The transistors Tr2 and Tr3 are npn-type bipolar transistors.

The resistors R1, R2, R3, and R4 are electrically connected in series between a constant voltage source Vcc2 and a circuit ground. The emitter of the transistor Tr1 is connected to the constant voltage source Vcc2 and the emitter of the transistor Tr2 is connected to the circuit ground. The resistor R1 is electrically connected between the base and the emitter of the transistor Tr1. The resistor R4 is electrically connected between the base and the emitter of the transistor Tr2. The connection point of the resistor R2 and the resistor R3 is included in the input terminal 420. In other words, the resistor R2 is electrically connected between the base of the transistor Tr1 and the input terminal 420 and the resistor R3 is electrically connected between the base of the transistor Tr2 and the input terminal 420.

The resistors R5 and R6 are electrically connected in series between the collector of the transistor Tr1 and a circuit ground. The emitter of the transistor Tr3 is connected to the circuit ground. The resistor R6 is electrically connected between the base and the emitter of the transistor Tr3. The resistor R5 is electrically connected between the collector of the transistor Tr1 and the base of the transistor Tr3.

The first output terminal 421 is electrically connected to the collector of the transistor Tr3. The second output terminal 422 is electrically connected to the collector of the transistor Tr2. Furthermore, the first output terminal 421 and the second output terminal 422 are electrically connected to a constant voltage source Vcc4 of the signal transmission circuit 3.

The signal transmission circuit 3 includes a buffer 31. The buffer 31 is electrically connected to the first output terminal 421 and the second output terminal 422. The buffer 31 thus receives the first PF selection signal Si11 and the second PF selection signal Si12 from the first output terminal 421 and the second output terminal 422.

According to such a configuration, the signal output portion 42 sets the first PF selection signal Si11 to the H level and sets the second PF selection signal Si12 to the L level as shown in FIG. 5 when the input terminal 420 (INPUT) is at the H level. In addition, the signal output portion 42 sets the first PF selection signal Si11 to the L level and sets the second PF selection signal Si12 to the H level when the input terminal 420 is at the L level.

Meanwhile, when the input terminal 420 has high impedance (Hi-Z), a current flows to the series circuit of the resistors R1, R2, R3, and R4 and voltages (at both ends of the resistors R1 and R4) resulting from division by the resistors R1, R2, R3, and R4 turn on the transistors Tr1 and Tr2. At this time, a current also flows to the series circuit of the resistors R5 and R6 and voltages (at both ends of the resistor R6) resulting from division by the resistors R5 and R6 also turn on the transistor Tr3. Thus, when the input terminal 420 has high impedance, the first PF selection signal Si11 and the second PF selection signal Si12 both reach the L level and this may lead to a malfunction of the device (sheet feed portion 14).

As shown in FIG. 7, the correction circuit 43 includes a constant voltage source Vcc3, a resistor R7, and the AND circuit 431. The constant voltage source Vcc3 is electrically connected to the input terminal 420 through the resistor R7. This embodiment assumes that the constant voltage sources Vcc1, Vcc2, Vcc3, and Vcc4 are power supplies of constant voltages (3.3 V as an example) each supplied from a single power supply circuit.

The AND circuit 431 includes a pair of diodes D1 and D2. It is therefore possible to embody the correction circuit 43 in a relatively simple configuration.

Specifically, the anodes of the pair of diodes D1 and D2 are electrically connected to the input terminal 420 of the signal output portion 42. The cathode of the diode D1 is electrically connected to the output terminal 410 of the signal generating portion 41. The cathode of the diode D2 is electrically connected to the reset terminal 411 of the signal generating portion 41.

The correction circuit 43 thus outputs the voltage V1 at the H level to the input terminal 420 only in a case where the first signal Si1 and the second signal Si2 are both at the H level. If at least one of the first signal Si1 and the second signal Si2 is at the L level, the correction circuit 43 outputs the voltage V1 at the L level to the input terminal 420.

Figure 8:
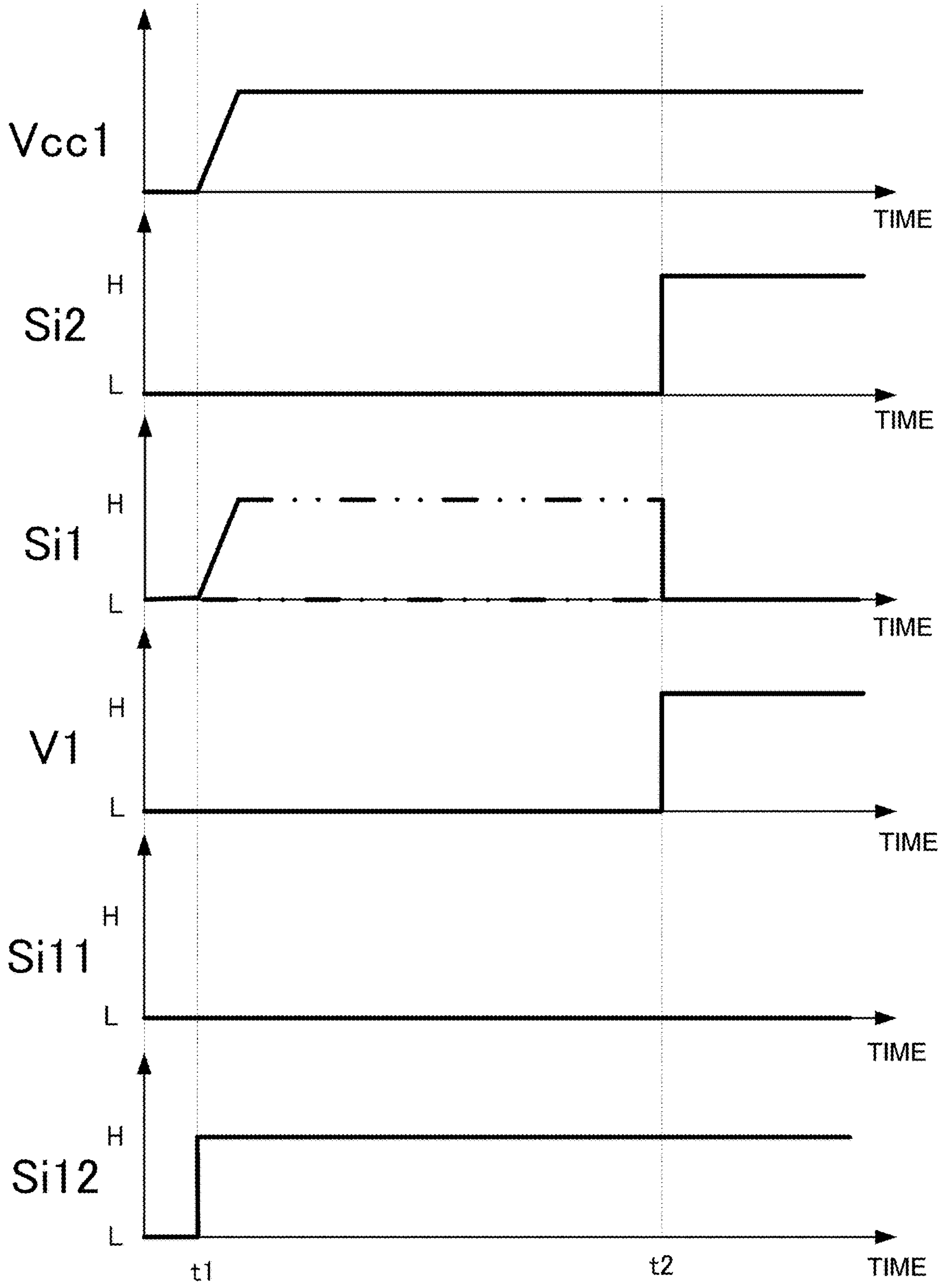
FIG. 8 is a timing chart showing an operation example of the control device of the image processing apparatus according to the embodiment 1.

FIG. 8 is a timing chart showing an operation example of the control device 17 having the configuration described above. FIG. 8 uses a transverse axis as a time axis and schematically shows the power supply voltage (Vcc1) of the signal generating portion 41, the second signal Si2 (reset signal), the first signal Si1, the voltage V1 of the input terminal 420, the first PF selection signal Si11, and the second PF selection signal Si12 in order from top to bottom.

As shown in FIG. 8, in the reset period from a time point t1 at which the power supply is turned on to a time point t2, the second signal Si2 (reset signal) reaches the L level, thereby causing the signal generating portion 41 to perform a reset operation. Therefore, in this reset period, the output terminal 410 of the signal generating portion 41 has high impedance and the first signal Si1 output from the output terminal 410 becomes unstable (shown by a two-dot chain line in FIG. 8).

However, in the reset period, the second signal Si2 (reset signal) reaches the L level, thereby causing the correction circuit 43 to set the voltage V1 of the input terminal 420 to the specific value (L level). Therefore, in the reset period (t1 to t2), the first PF selection signal Si11 reaches the L level and the second PF selection signal Si12 reaches the H level.

At and after the time point t2 at which the reset operation is completed, it is possible for the signal generating portion 41 to output any control signals (the first PF selection signal Si11 and the second PF selection signal Si12) from the signal output portion 42 by using the the first signal Si1.

[3] Comparative Example

It is also possible for the image processing apparatus 10 to make the device (sheet feed portion 14) less likely to malfunction in a configuration (comparative example) in which the power supplies (constant voltage sources Vcc1 and Vcc4) of the signal generating portion 41 and the second substrate 22 and the power supply (constant voltage source Vcc2) of the signal output portion 42 are separated instead of the correction circuit 43 described above.

That is, during a reset operation (reset period) of the signal generating portion 41, power supply is stopped from the constant voltage source Vcc2 to the signal output portion 42, thereby allowing both the first PF selection signal Si11 and the second PF selection signal Si12 to be set to the H level even when the input terminal 420 has high impedance. This makes it possible to make the device (sheet feed portion 14) less likely to malfunction because of the high impedance of the input terminal 420.

In contrast, the image processing apparatus 10 according to this embodiment includes the correction circuit 43, thereby preventing the input terminal 420 from having high impedance in the first place. Even if the power supplies (constant voltage sources Vcc1 and Vcc4) of the signal generating portion 41 and the second substrate 22, and the power supply (constant voltage source Vcc2) of the signal output portion 42 are put together, the device (sheet feed portion 14) is thus less likely to malfunction. The image processing apparatus 10 according to this embodiment thus has an advantage that it is possible to decrease the number of terminals of the signal generating portion 41 and omit (or simplify) a power supply control circuit in comparison with the comparative example.

[4] Modification Example

The plurality of components included in the image processing apparatus 10 may be distributed and provided in a plurality of housings.

In addition, control signals output from the control device 17 are not limited to a PF selection signal and a clock signal.

In addition, a device controlled by using a control signal is not limited to the sheet feed portion 14.

In addition, the image processing apparatus 10 does not necessarily have to include the first substrate 21 serving as the transmission source of a control signal and the second substrate 22 serving the transmission destination of the control signal. For example, the transmission source and the transmission destination of the control signal may be included in the same substrate.

In addition, the specific configuration of the signal transmission circuit 3 is not limited to the configuration shown in FIG. 7. It is possible to change the configuration as appropriate as long as it is possible to attain a similar function.

SUPPLEMENTARY NOTES OF INVENTION

The gist of the invention extracted from the embodiments described above will be supplementarily noted below. It is to be noted that the respective configurations and the respective processing functions described in the following supplementary notes can be sorted out and used in any combination.

Supplementary Note 1

A control device including:

a signal generating portion configured to output a first signal from an output terminal;

a signal output portion including an input terminal configured to receive the first signal, the signal output portion being configured to output a control signal corresponding to the first signal; and a correction circuit that is inserted between the output terminal of the signal generating portion and the input terminal of the signal output portion, the correction circuit being configured to set a voltage of the input terminal to a specific value in accordance with a second signal from outside.

Supplementary Note 2

The control device according to Supplementary Note 1, in which the second signal is a reset signal that is input to the signal generating portion and is used to reset the signal generating portion.

Supplementary Note 3

The control device according to Supplementary Note 1 or 2, in which the correction circuit includes an AND circuit configured to output logical conjunction of the first signal and the second signal to the input terminal.

Supplementary Note 4

The control device according to Supplementary Note 3, in which the AND circuit includes a pair of diodes.

Supplementary Note 5

An image processing apparatus including:

the control device according to any of Supplementary Notes 1 to 4; and a body having an image processing function.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A control device comprising:

a signal generating portion configured to output a first signal from an output terminal;

a signal output portion including an input terminal configured to receive the first signal, the signal output portion being configured to output a control signal corresponding to the first signal; and a correction circuit that is inserted between the output terminal of the signal generating portion and the input terminal of the signal output portion, the correction circuit being configured to set a voltage of the input terminal to a specific value in accordance with a second signal from outside, wherein the second signal is a reset signal that is input to a reset terminal of the signal generating portion and is used to reset the signal generating portion, and the correction circuit includes an AND circuit connected to the output terminal and the reset terminal of the signal generating portion and configured to output logical conjunction of the first signal and the second signal to the input terminal, the first signal and the second signal being input from the output terminal and the reset terminal.

2. The control device according to claim 1, wherein the AND circuit includes a pair of diodes.

3. An image processing apparatus comprising:

the control device according to claim 1; and a body having an image processing function.

* * * * *